United States Patent [19]
Kim et al.

[11] Patent Number: 6,096,602
[45] Date of Patent: Aug. 1, 2000

[54] METHOD FOR FABRICATING FLASH MEMORY CELL

[75] Inventors: Ji Hyeog Kim, Chungcheongnam-do; Sung Youn Kim, Chungcheongbuk-do, both of Rep. of Korea

[73] Assignee: LG Semicon Co., Ltd., Chungcheongbuk-Do, Rep. of Korea

[21] Appl. No.: 09/228,750

[22] Filed: Jan. 12, 1999

[30] Foreign Application Priority Data

Jan. 13, 1998 [KR] Rep. of Korea ...................... 733/1998

[51] Int. Cl.⁷ ................................................. H01L 21/336
[52] U.S. Cl. .......................... 438/257; 438/211; 438/258; 438/264; 438/265; 438/266
[58] Field of Search ..................... 438/257, 258, 438/265, 266, 211, 264; 257/314, 315, 316, 319, 323, 324

[56] References Cited

U.S. PATENT DOCUMENTS

| | | | |
|---|---|---|---|
| 5,070,032 | 12/1991 | Yuan et al. | 438/267 |
| 5,658,813 | 8/1997 | Enomoto | 438/258 |
| 5,756,385 | 5/1998 | Yuan et al. | 438/258 |
| 5,763,309 | 6/1998 | Chang | 438/262 |
| 5,766,996 | 12/1998 | Hayakawa et al. | 438/257 |
| 5,915,176 | 6/1999 | Lim | 438/257 |
| 5,936,889 | 8/1999 | Choi | 365/185.22 |

OTHER PUBLICATIONS

Yoshimitsu Yamauchi et al,; "A New Cell Structure for Sub–quarter Micron High Density Flash Memory"; IEDM 1995, pp. 267–270.

Primary Examiner—Carl Whitehead, Jr.
Assistant Examiner—Khanh Duong
Attorney, Agent, or Firm—Morgan, Lewis & Bockius LLP

[57] ABSTRACT

A method for fabricating a flash memory cell includes forming first gate insulating films and polysilicon layers in succession on a substrate, wherein the first gate insulating films and the polysilicon layers extend in a first direction, and forming buried regions in the substrate under portions of the polysilicon layers. The method includes forming second insulating films, control gates, and cap insulating films in succession on the substrate and the polysilicon layers, and forming first sidewall spacers at both sides of the control gates. The method further includes forming floating gates by patterning the polysilicon layers using the first sidewall spacers as masks, forming field insulating films between the floating gates, and forming erasure gates on the field insulating films between the floating gates.

21 Claims, 19 Drawing Sheets

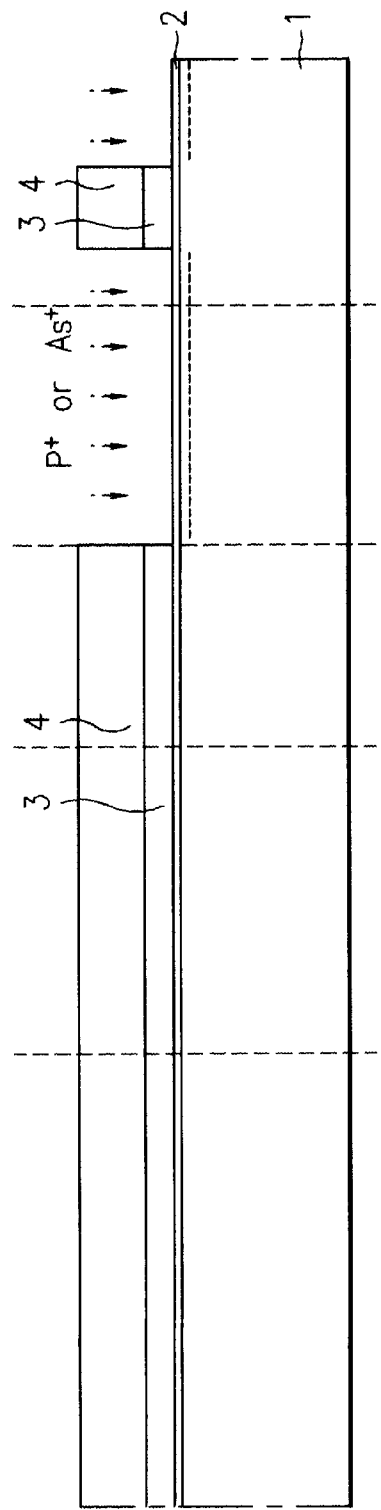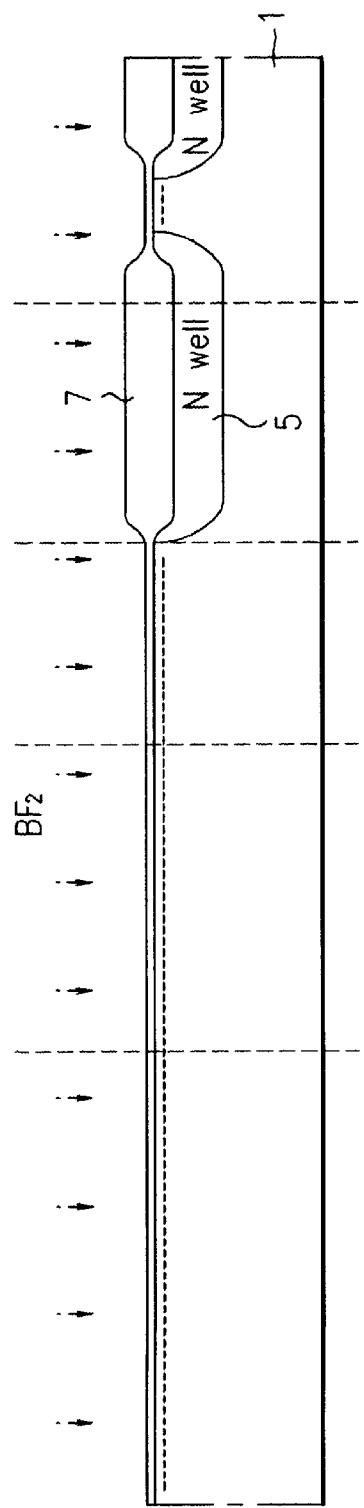

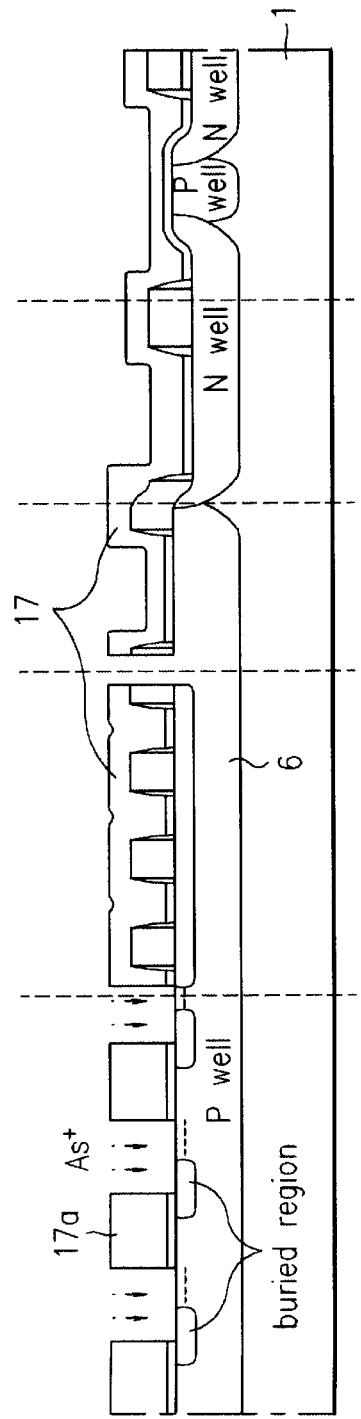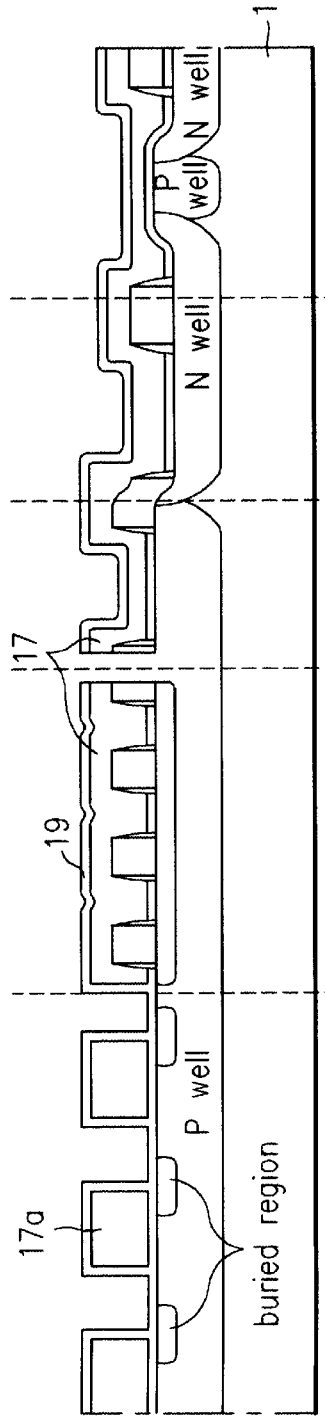

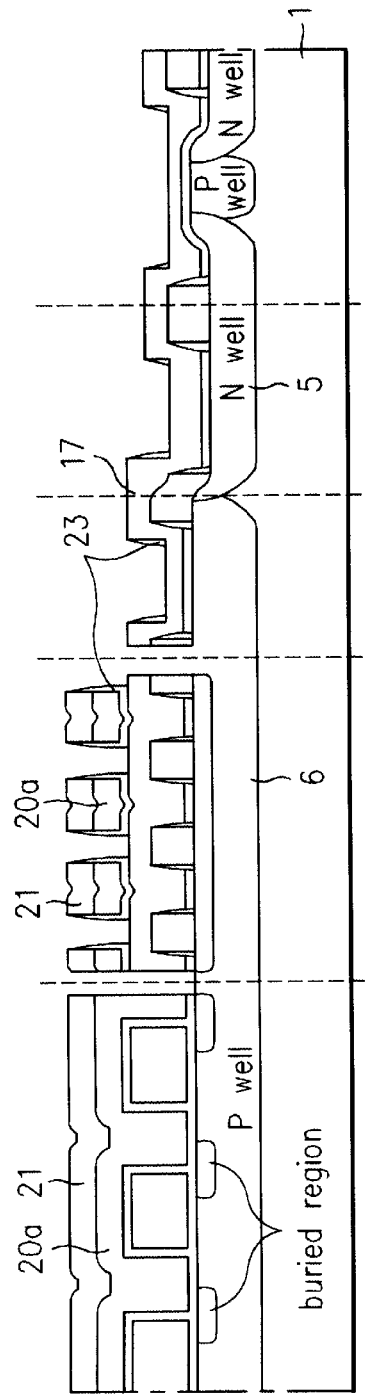
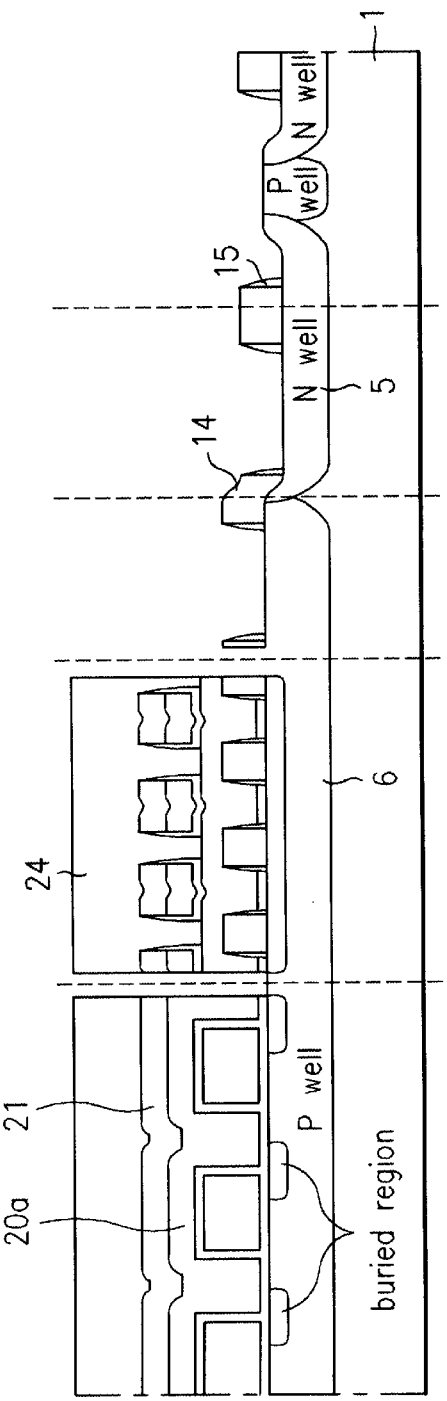

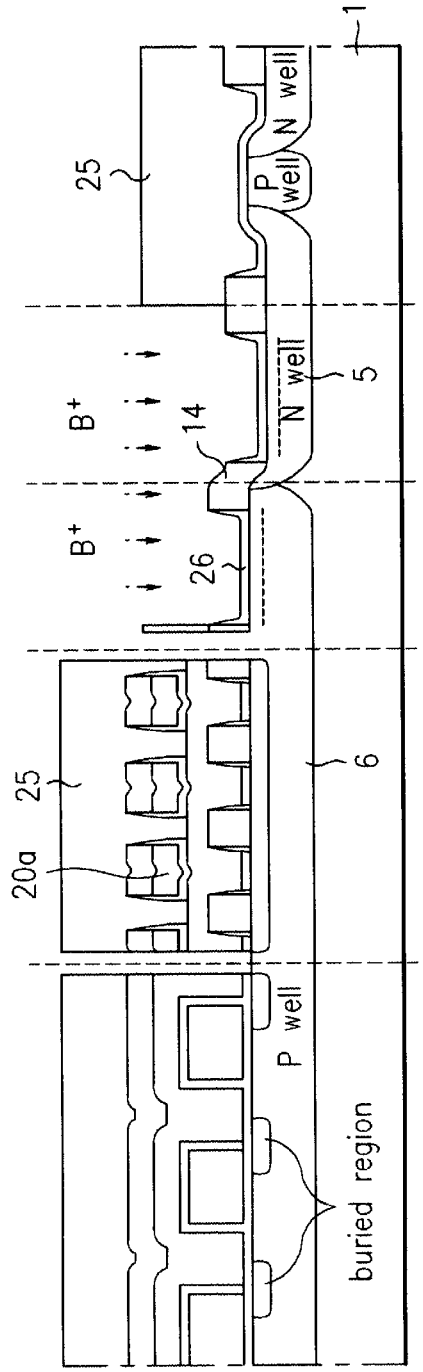
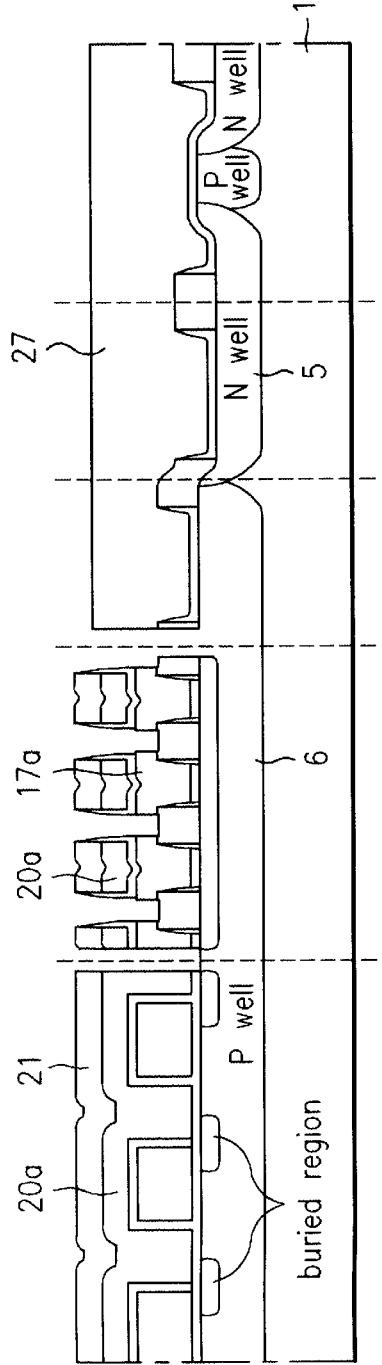

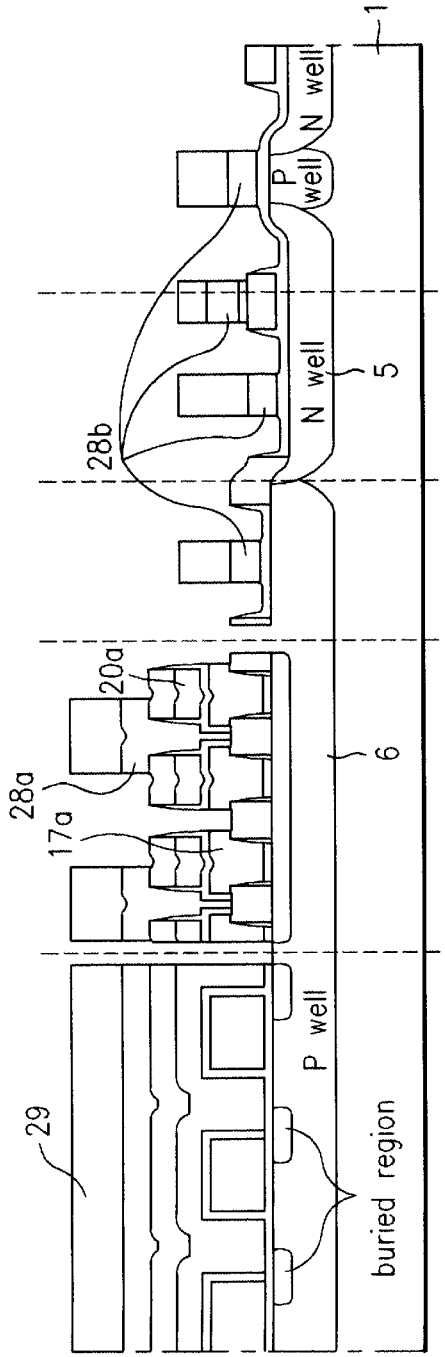
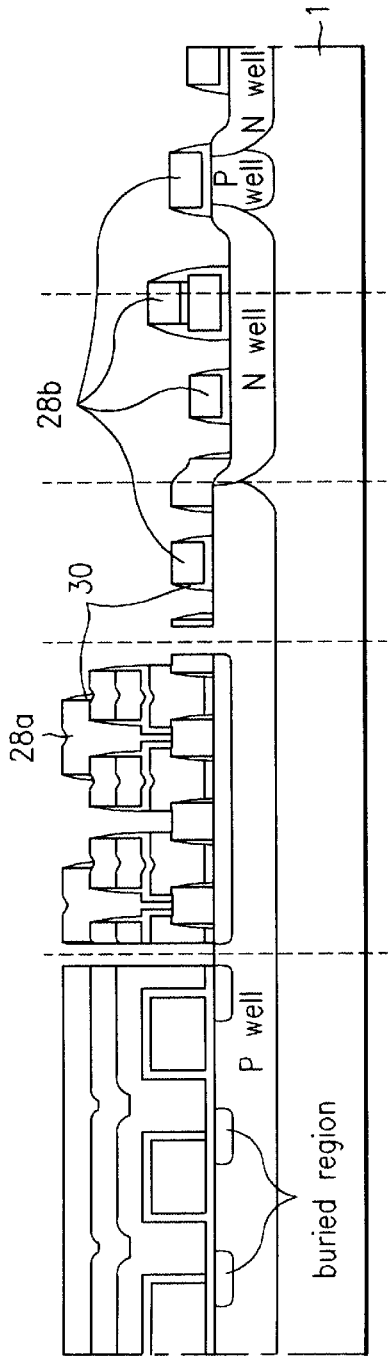

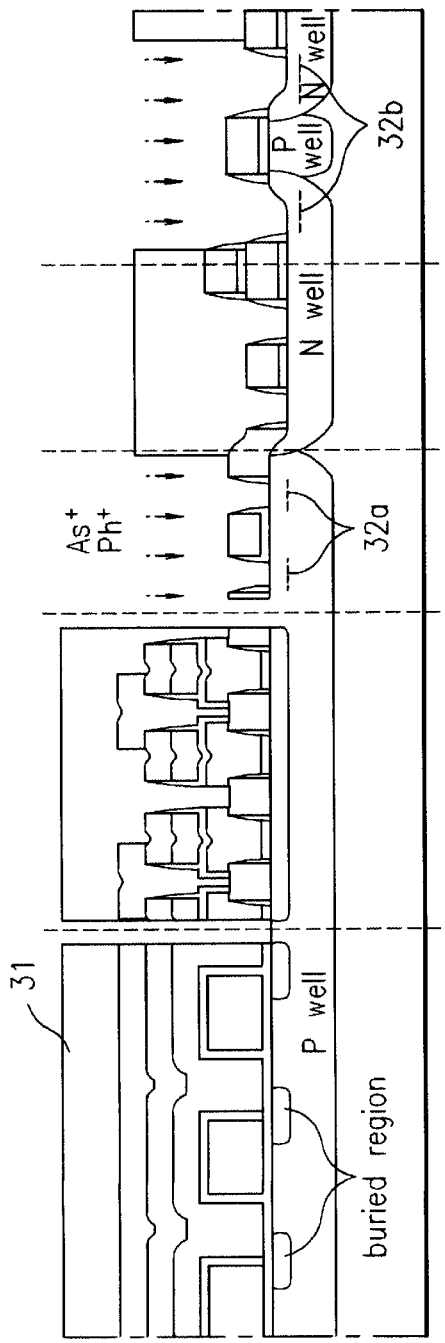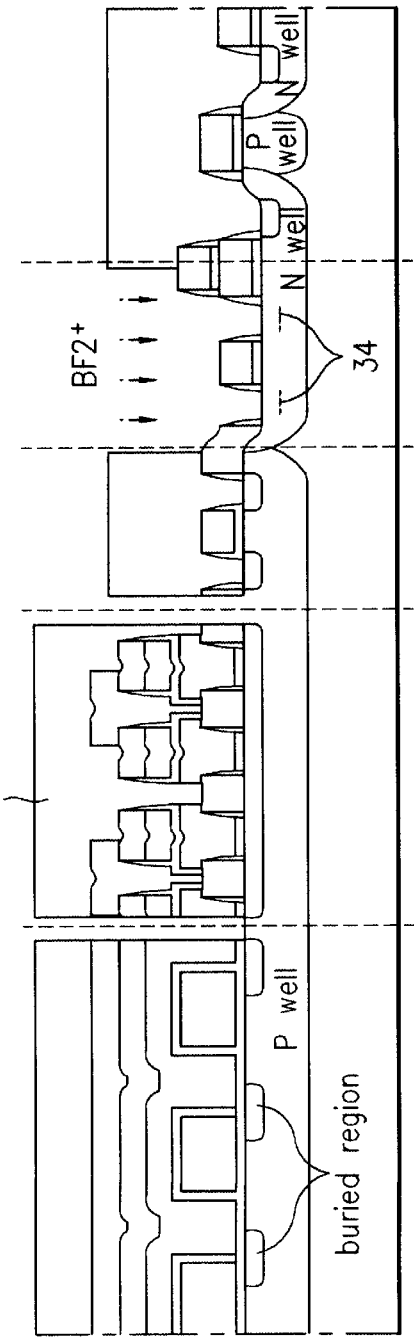

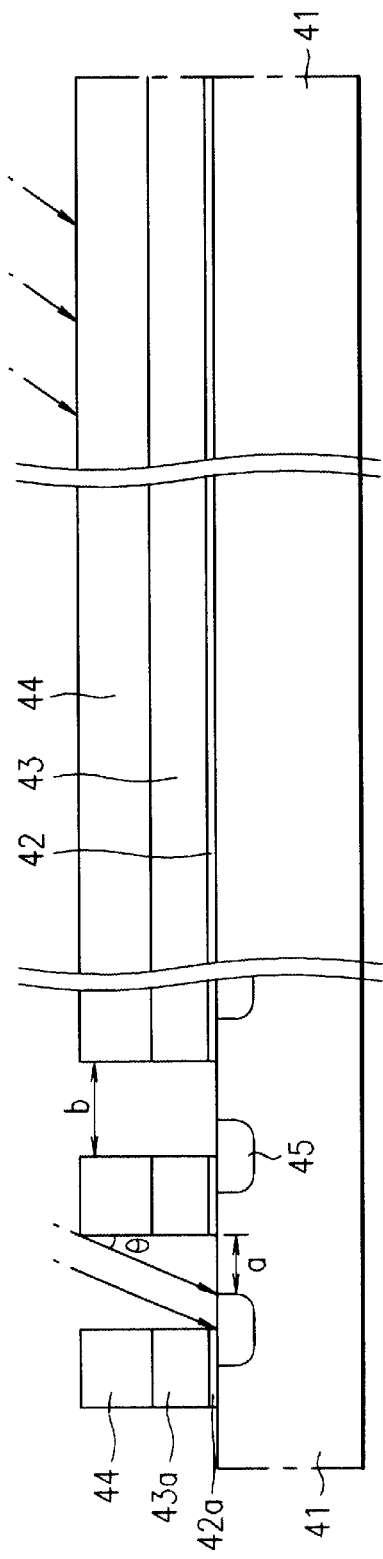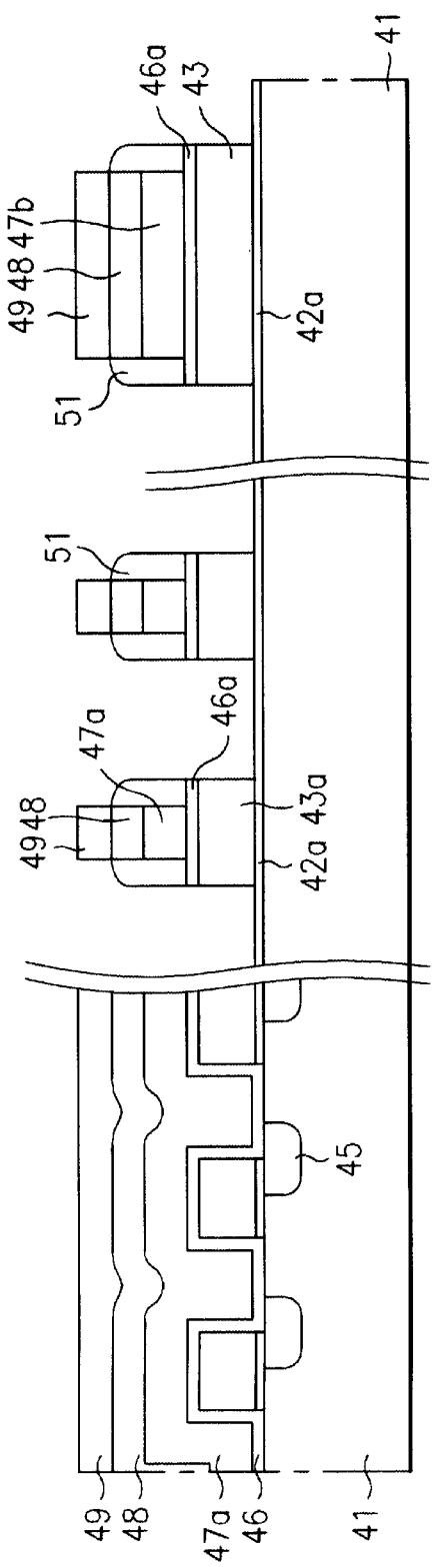

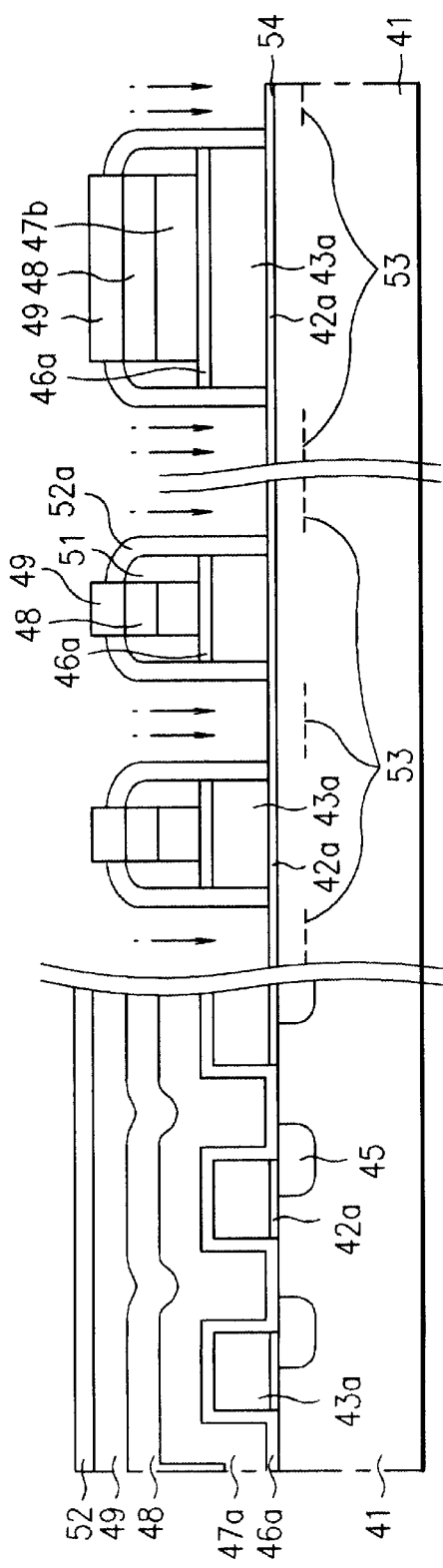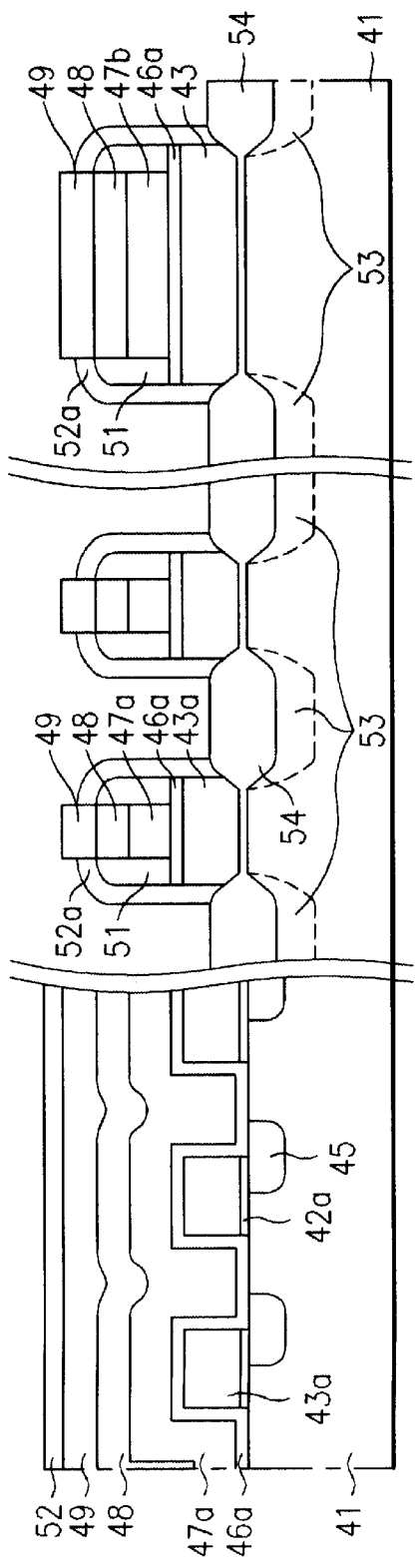

METHOD FOR FABRICATING FLASH MEMORY CELL

This application claims the benefit of Korean Application No. 733/1998 filed Jan. 13, 1998, which is hereby incorporated by reference.

BACKGROUND OF THE INVENTION

1. Field of the Invention

The present invention relates to a method for fabricating a flash memory cell, and more particularly, to a method for fabricating a flash memory cell which simplifies the fabricating process and improves flatness of the device.

2. Discussion of the Related Art

A related method for fabricating a flash memory cell will be explained with reference to the attached drawings. FIGS. 1A–1Y illustrate the process steps of the related method for fabricating a flash memory cell. Each of FIGS. 1A–1Y illustrates cross-sectional views of, from left to right, a control gate of the cell, a crossing part of the control gate and a floating gate, an NMOS transistor formed in a peripheral region, a PMOS transistor formed in a peripheral region, and an HV NMOS transistor, which are hereinafter respectively referred to as first, second, third, fourth and fifth regions in the order.

As shown in FIG. 1A, the related method for fabricating a flash memory cell starts with depositing a buffer oxide film 2 and a nitride film 3 on a semiconductor substrate 1 in succession. Then, a first photoresist film 4 is coated on the nitride film 3 and subjected to selective patterning by exposure and development to remove the first photoresist film 4 in the fourth region totally and a portion of the first photoresist film 4 in the fifth region. The nitride film 3 and the buffer oxide film 2 are removed using the patterned first photoresist film 4 as a mask. N-type ions, such as phosphorus or arsenic, are injected into the semiconductor substrate 1 exposed in the fourth and fifth regions.

As shown in FIG. 1B, after N-wells 5 are formed by a diffusion process, a field oxide film 7 is formed in the fourth region by thermal oxidation. The photoresist film 4, the nitride film 3, and the buffer oxide film 2 are then removed, and boron ions $BF_2$ are injected into the entire surface. At this time, a thin oxide film 7 is formed on a surface of the semiconductor substrate 1.

As shown in FIG. 1C, a P-well 6 is formed by diffusion. At this time, the N-well 5 is diffused deeper into the semiconductor substrate 1. Then, P-type boron ions are injected into the entire surface to form boron ions in the surface of the semiconductor substrate 1.

As shown in FIG. 1D, a first oxide film 8 is formed on the entire surface. Then, in order to form a buried layer in the first and second regions, a second photoresist film 9 is coated on the first oxide film 8 and selectively patterned. Then, the first oxide film 8 is selectively etched.

As shown in FIG. 1E, after the second photoresist film 9 is removed, an oxide film is deposited on an entire surface and etched back to form first sidewall spacers 10 at both sides of the selectively etched first oxide film 8. Then, arsenic ions are injected into the semiconductor substrate 1 to form a buried region.

As shown in FIG. 1F, after the first oxide film 8 and the first sidewall spacers 10 are removed, a third photoresist film 11 is coated on the entire surface and subjected to patterning to remove the third photoresist film 11 in the first region and the second region. Boron ions are then injected into the exposed surface of the P well 6 to form a channel stop region.

As shown in FIG. 1G, after the third photoresist film 11 is removed, a fourth photoresist film 12 is coated on the semiconductor substrate 1 and subjected to selective patterning to form channel stop regions on both sides of the third region. Boron ions $B^+$ are injected into the exposed surface of the P well 6 to form the channel stop region.

As shown in FIG. 1H, after the fourth photoresist film 12 is removed, an oxide film is deposited on an entire surface. Then, a fifth photoresist film 13 is coated on the oxide film and patterned. The oxide film is selectively etched to form an isolating oxide film 14 spaced from an upper portion of the buried region formed in the P well 6 in the second region. The isolating oxide films 14 are also formed in regions distinguishing the third, fourth and fifth regions.

As shown in FIG. 1I, after the fifth photoresist film 13 is removed, an oxide film is formed on an entire surface and etched back to form second sidewall spacers 15 at both sides of the isolating oxide films 14.

As shown in FIG. 1J, a first gate oxide film 16 is formed on the entire surface, and a first polysilicon layer 17 is deposited on the first gate oxide film 16. Then, a sixth photoresist film 18 is coated on the polysilicon layer 17 and subjected to selective patterning by exposure and development. Then, the first polysilicon layer 17 is subjected to anisotropic etching using the sixth photoresist film 18 as a mask to expose a portion of each of the buried regions at fixed intervals in the first region to form floating gates 17a and to orient the first polysilicon 17 in one direction in the second region. At this time, defects may occur that may cause a current difference in a reading operation depending on a distance of the floating gate 17a from the buried regions.

As shown in FIG. 1K, after the sixth photoresist film 18 is removed, arsenic ions $As^+$ are injected into the exposed surface of the substrate to increase on-current of a control gate to be formed later.

As shown in FIG. 1L, a thin tunnel oxide film 19 is formed on the entire surface inclusive of the etched first polysilicon layer 17 and the floating gates 17a.

As shown in FIG. 1M, a second polysilicon layer 20 and a cap oxide film 21 are deposited on the entire surface. Then, a seventh photoresist film 22 is coated on the cap oxide film 21. The seventh photoresist film 22 is subjected to selective patterning by exposure and development to leave the portions of the seventh photoresist film in the first region and between the isolating oxide films 14 in the second region.

As shown in FIG. 1N, the cap oxide film 21 and the second polysilicon layer 20 are subjected to anisotropic etching using the patterned seventh photoresist film 22 to form control gates 20a. Then, the second polysilicon layer 20 and the tunnel oxide film 19 are removed from the third, fourth and fifth regions. A thin oxide film is deposited on the entire surface and etched back to form third sidewall spacers 23 at both sides of the cap oxide films 21 and the control gates 20a and at both sides of the first polysilicon layer 17 in the third, fourth, and fifth regions.

As shown in FIG. 1O, after the seventh photoresist film 22 is removed, an eighth photoresist film 24 is coated and subjected to selective patterning by exposure and development to leave the eighth photoresist film 24 only on the first, and second regions. Then, after removal of the third sidewall spacers 23 at sides of the first polysilicon layer 17 in the third, fourth and fifth regions, the first polysilicon layer 17 is removed to expose the isolating oxide films 14 and the second sidewall spacers 15.

As shown in FIG. 1P, after the eighth photoresist film 24 is removed, a ninth photoresist film 25 is coated and subjected to selective patterning by exposure and development to expose the P well 6 and the N well 5 in the third, and fourth regions. Gate oxide films 26 are formed in the third and fourth regions by oxidation using the patterned ninth photoresist film 25 as a mask. Then, boron ions $B^+$ are injected thereto.

As shown in FIG. 1Q, after the ninth photoresist film 25 is removed, a tenth photoresist film 27 is coated on the entire surface and subjected to selective patterning to leave the tenth photoresist film 27 only in the third, fourth, and fifth regions. Then, the first polysilicon layer 17 in the second region is subjected to anisotropic etching using the cap oxide films 21 and the control gates 20a as masks to form a floating gate, thereby isolating the floating gates 17a by a cell unit.

As shown in FIG. 1R, after the tenth photoresist 27 is removed, a third polysilicon layer 28 is deposited on the entire surface and an eleventh photoresist film 29 is coated thereon. Then, the eleventh photoresist film 29 is subjected to selective patterning by exposure and development to expose a center porion of the second region and to leave the eleventh photoresist film 29 on portions of the third, fourth and fifth regions in which gate electrodes are to be formed. Then, the third polysilicon layer 28 is subjected to anisotropic etching using the patterned eleventh photoresist film 29 as a mask to form an erasure gate 28a in the second region and gate electrodes 28b in the third, fourth and fifth regions.

As shown in FIG. 1S, the eleventh photoresist film 29 is removed. Then, an oxide film is deposited on an entire surface and etched back to form fourth sidewall oxide films 30 at sides of the erasure gate 28a and the gate electrodes 28b.

As shown in FIG. 1T, a twelfth photoresist film 31 is coated and subjected to selective patterning by exposure and development to leave the twelfth photoresist film 31 in the first, second and fourth regions. Either n-type arsenic or phosphorus ions are injected into the exposed portions of the third and fourth regions to form first source/drain regions 32a and N-type impurity regions 32b.

As shown in FIG. 1U, after the twelfth photoresist film 31 is removed, a thirteenth photoresist film 33 is coated and subjected to selective patterning by exposure and development to expose the fourth region. Then, p-type boron ions $BF_2^+$ are injected into the fourth region using the patterned thirteenth photoresist film 33 as a mask to form second source/drain regions 34.

As shown in FIG. 1V, the thirteenth photoresist film 33 is removed. Then a second oxide film 35 is deposited, and a flat protection film 36 is deposited on the second oxide film 35.

As shown in FIG. 1W, a fourteenth photoresist film 37 is coated and subjected to selective patterning by exposure and development to expose portions of the first and second source/drain regions 32a and 34, the N- type impurity regions 32b, and the gate electrodes 28b formed on the isolating oxide film 14 in the fourth region. Then, the flat protection film 36 and the second oxide film 35 are subjected to anisotropic etching using the patterned fourteenth photoresist film 37 as a mask to form contact holes.

As shown in FIG. 1X, a tungsten layer is formed on an entire surface and etched back to form tungsten plugs 38 contacting the first and second source/drain regions 32a, 34 and the N-type impurity regions 32b.

As shown in FIG. 1Y, an aluminum layer is deposited on the entire surface and then patterned to form an aluminum wiring layer 39 on the tungsten plugs 38, and the first and second regions.

The above related art flash memory cell has the following problems. First, variation in device electric performance caused by a varying degree of mis-alignment between the buried regions and the floating gates, which occurs during photolithography, degrades operative reliability. Second, as the isolating insulating film is formed by depositing and photolithographying of a CVD oxide film, a flatness of the device becomes poor, thereby decreasing reliability of the following patterning steps. Third, the complicated process with many masking steps leads to a low productivity.

SUMMARY OF THE INVENTION

Accordingly, the present invention is directed to a method for fabricating a flash memory cell that substantially obviates one or more of the problems due to limitations and disadvantages of the related art.

An object of the present invention is to provide a method for fabricating a flash memory cell which can provide a simple fabricating process and a good flatness.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a method for fabricating a flash memory cell having a cell region and a peripheral region, the method including the steps of: forming first gate insulating films and floating gates on a substrate in succession, the first gate insulating films and floating gates extending in a first direction; making a tilted ion injection into portions of the substrate under the floating gates at an angle with respect to a line perpendicular to the substrate, to form buried regions extending in the first direction; forming control gates, and first and second cap insulating films, each having a portion crossing the floating gates in a second direction substantially perpendicular to the first direction in the cell region, and forming polysilicon pattern layers, second gate insulating films, first gate electrodes, and first and second cap insulating films in the peripheral region; forming first sidewall spacers at a plurality of sides of the control gates and the first cap insulating films in the cell region, and at a plurality of sides of the first gate electrodes and first cap insulating films in the peripheral region; forming second sidewall spacers at a plurality of sides of the floating gates, the first sidewall spacers, and the second cap insulating films in the cell region, and at a plurality of sides of the polysilicon pattern layers, the first sidewall spacers, and the second cap insulating films in the peripheral region; forming field insulating films on the substrate using the floating gates, the control gates, the polysilicon pattern layers, and the gate electrodes as masks; removing in the peripheral region the second sidewall spacers, the second cap oxide film, the first cap insulating films, the first sidewall spacers, the first gate electrodes, the second gate insulating films, and the polysilicon pattern layers; forming erasure gates on the field insulating films between the floating gates extending in the second direction in the cell region and forming second gates in the peripheral region.

In another aspect of the present invention, a method for fabricating a flash memory cell includes the steps of: forming first gate insulating films and polysilicon layers in succession on a substrate, wherein the first gate insulating films and the polysilicon layers extend in a first direction; forming buried regions in the substrate under portions of the polysilicon layers; forming second insulating films, control gates, and cap insulating films in succession on the substrate and the polysilicon layers; forming first sidewall spacers at a plurality of sides of the control gates; forming floating gates by patterning the polysilicon layers using the first sidewall spacers as masks; forming field insulating films on the substrate between the floating gates; forming erasure gates on the field insulating films between the floating gates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 3A–3F illustrate cross sections showing the process steps of a method for fabricating a flash memory cell in accordance with a first preferred embodiment of the present invention; and, FIGS. 4A and 4B illustrate cross sections showing the process steps of a method for fabricating a flash memory cell in accordance with a second preferred embodiment of the present invention.

DETAILED DESCRIPTION OF THE PREFERRED EMBODIMENT

Figure 1C:
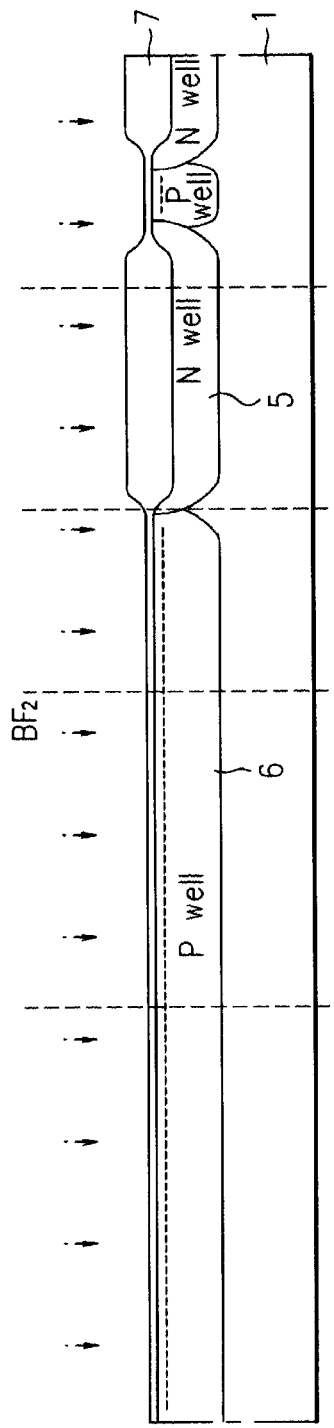
FIGS. 1A–1Y illustrate cross sections showing the process steps of a related method for fabricating a flash memory cell.
Figure 1D:
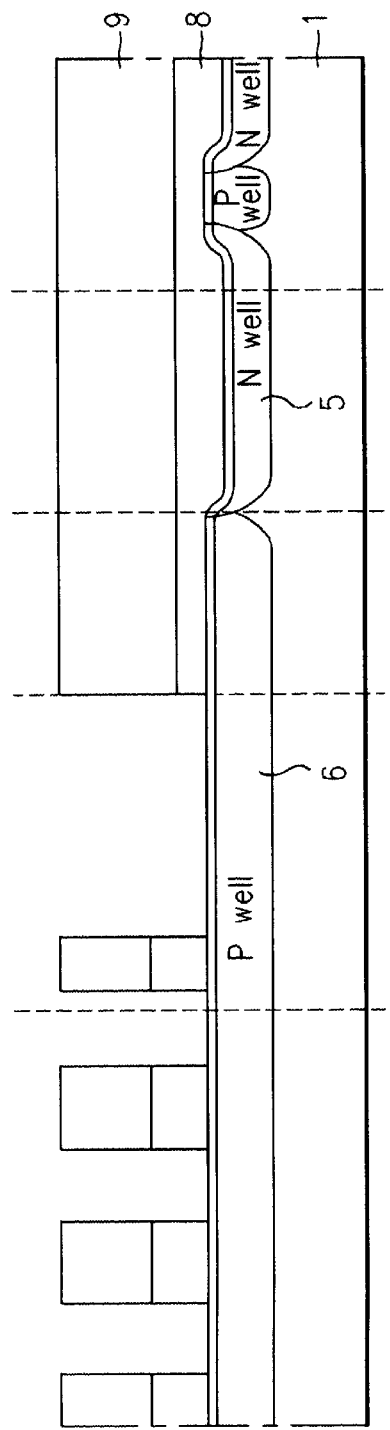
Figure 1E:
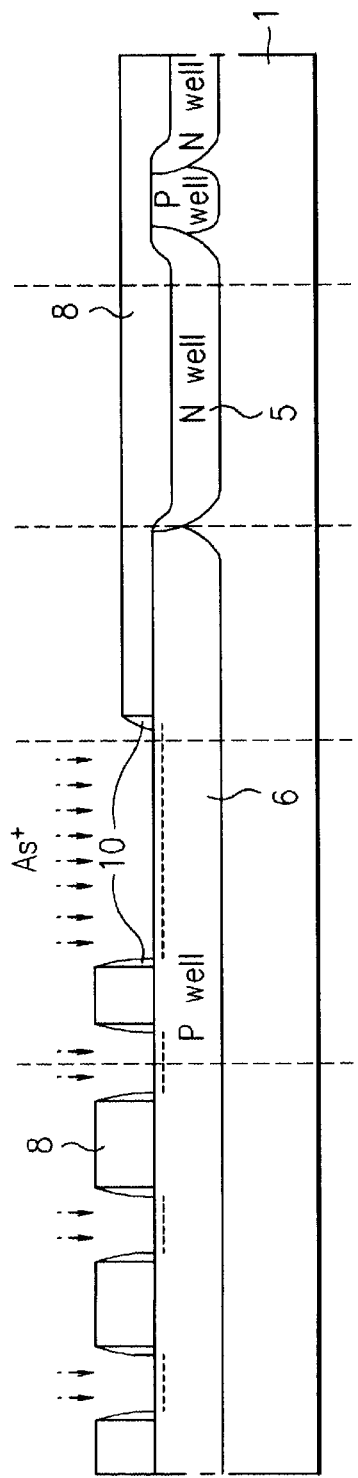
Figure 1F:
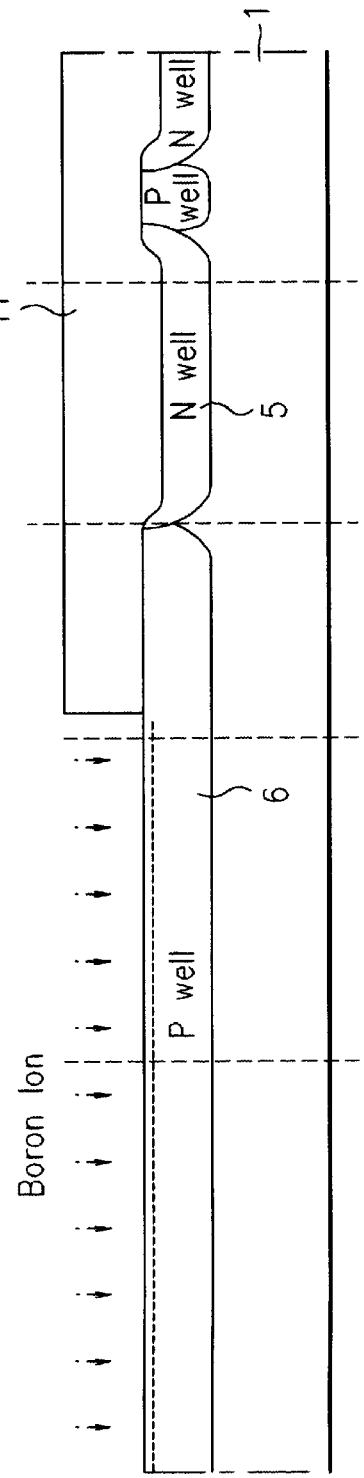
Figure 1G:
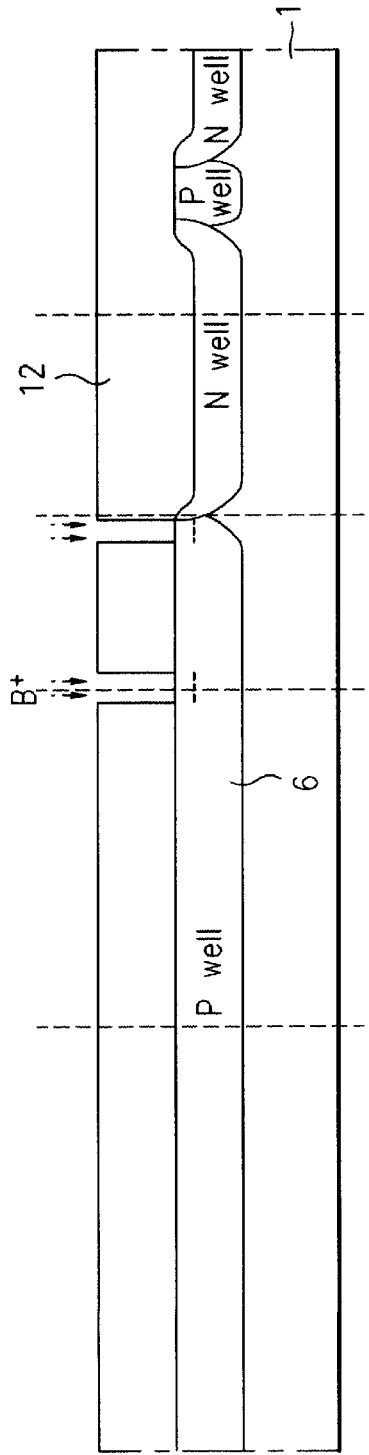
Figure 1H:
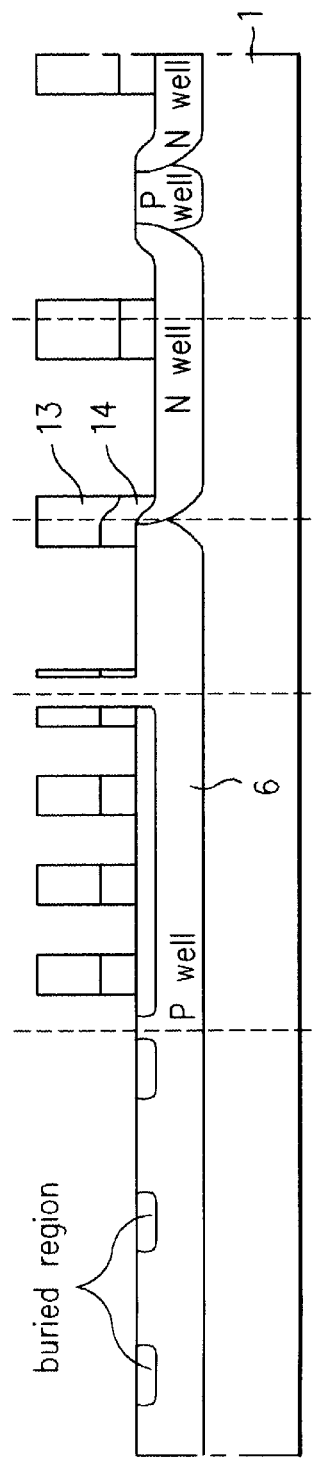
Figure 1I:
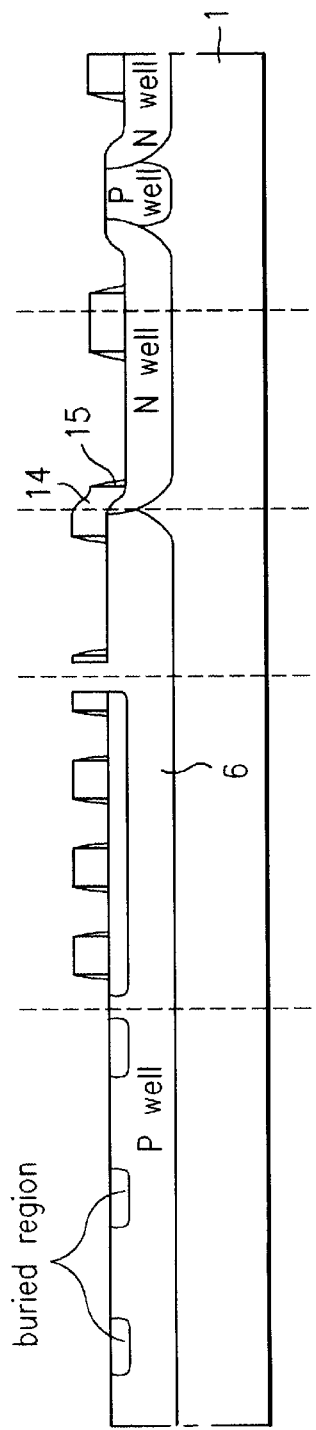
Figure 1J:
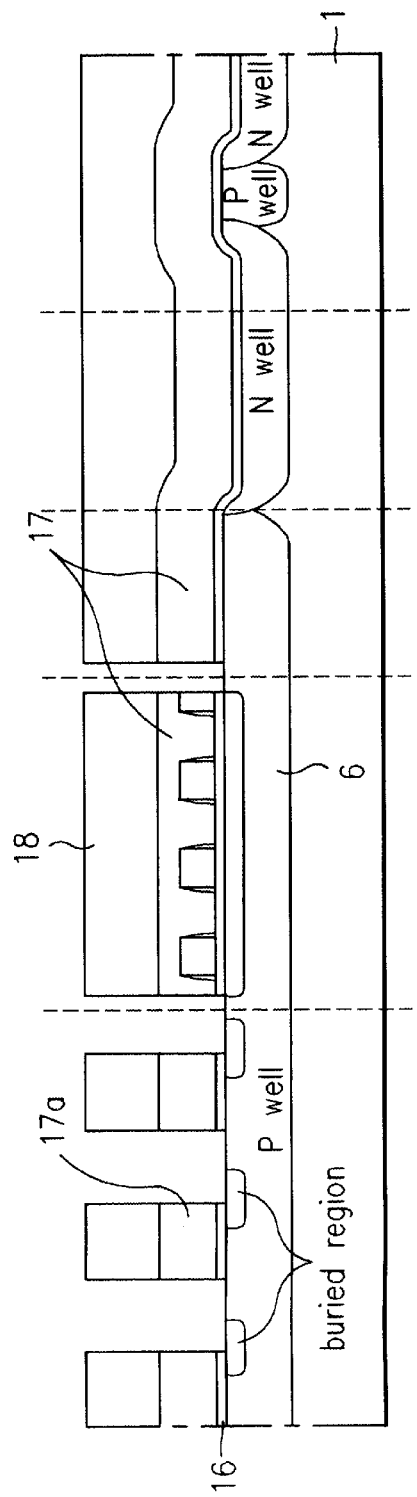
Figure 1M:
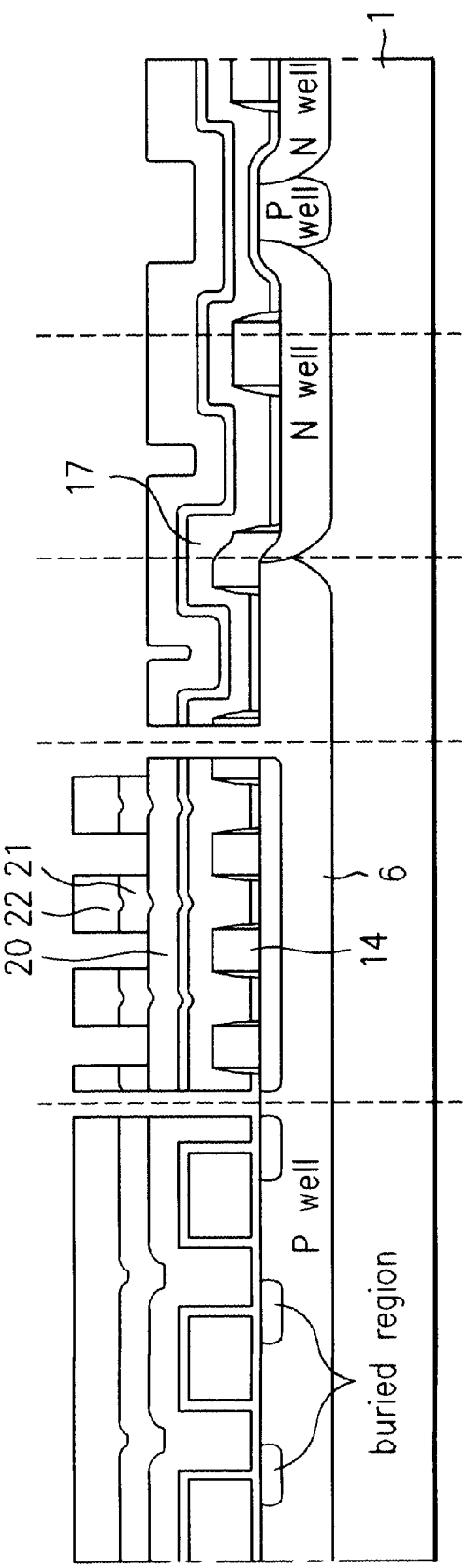
Figure 1V:
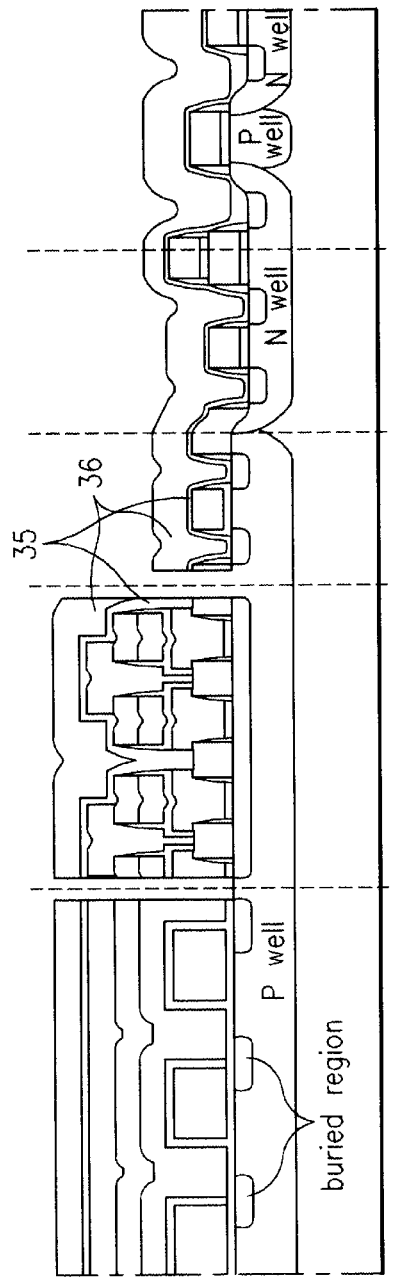
Figure 1W:
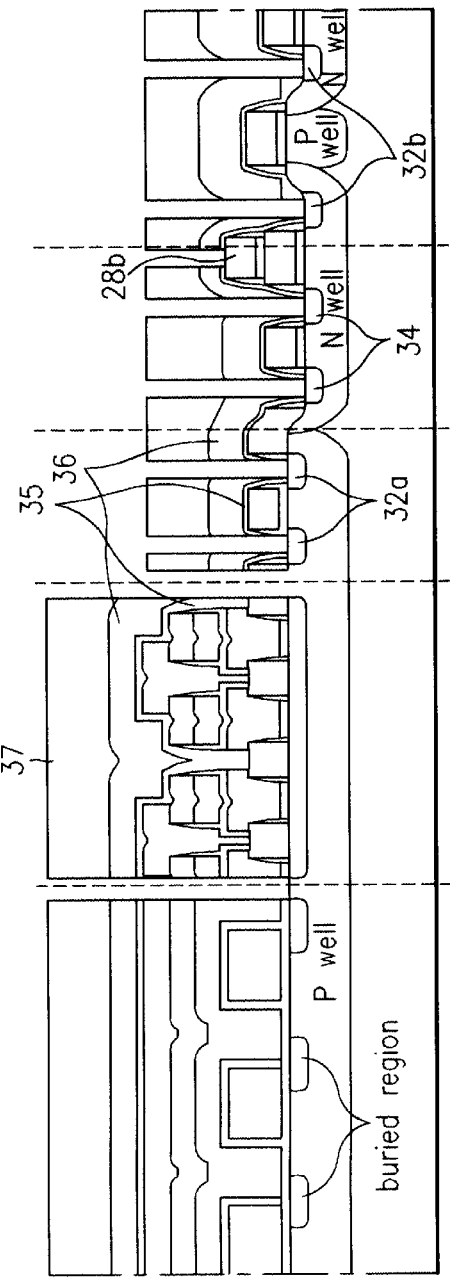
Figure 1X:
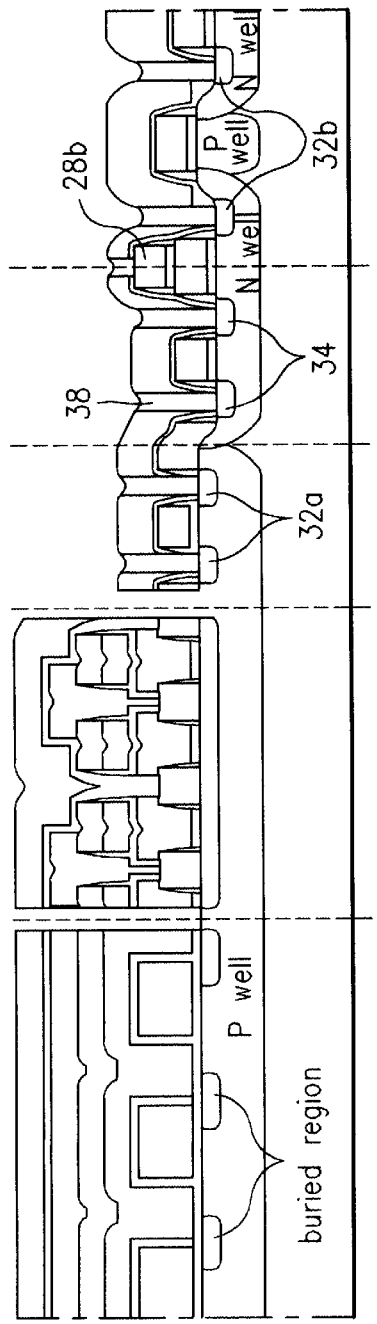
Figure 1Y:
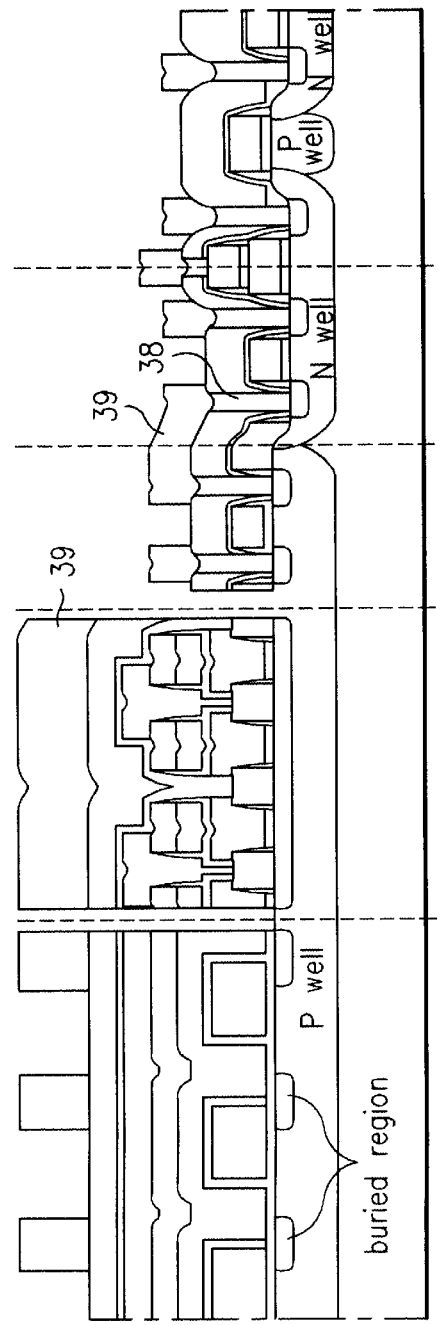
Figure 2A:
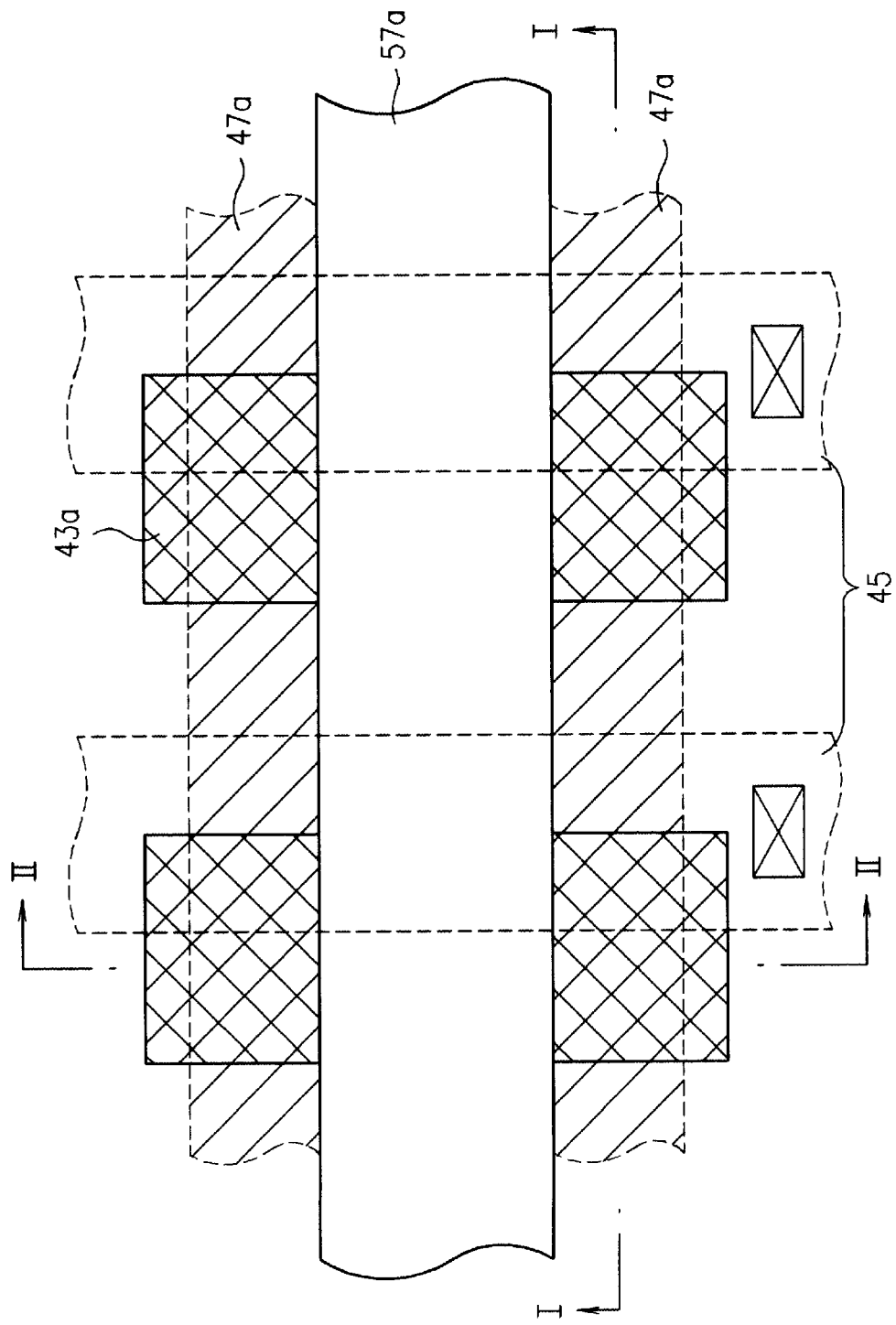
FIG. 2A illustrates a lay-out of a flash memory cell in accordance with a preferred embodiment of the present invention.
Figure 2B:
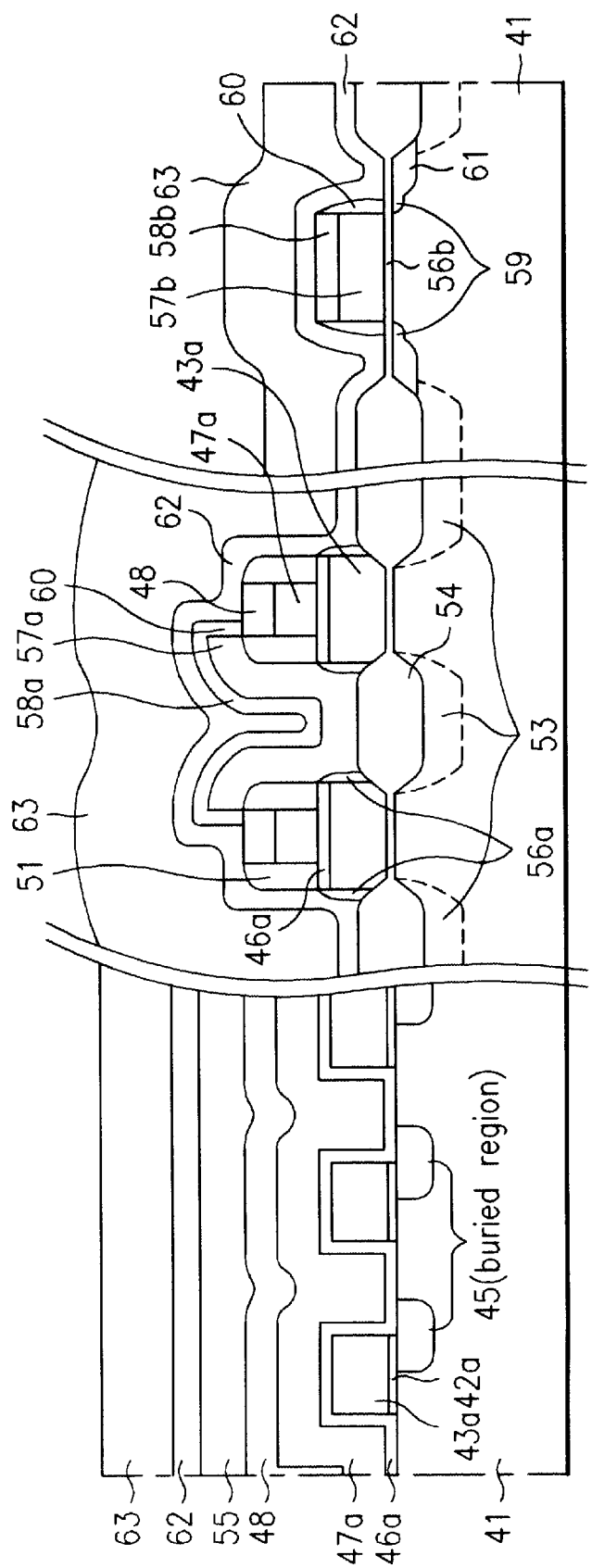
FIG. 2B illustrates a cross section of a flash memory cell in accordance with a preferred embodiment of the present invention.

Reference will now be made in detail to the preferred embodiments of the present invention, examples of which are illustrated in the accompanying drawings. FIG. 2A illustrates a lay-out of a flash memory cell in accordance with a preferred embodiment of the present invention. FIG. 2B illustrates a cross section of a flash memory cell in accordance with a preferred embodiment of the present invention. FIGS. 3A–3F illustrate cross sections showing the process steps of a method for fabricating a flash memory cell in accordance with a first preferred embodiment of the present invention. Each of FIGS. 2B and 3A–3F illustrates, from left to right, a cross section along the line I—I and a cross section along the line II—II as shown in FIG. 2A, and a peripheral region. In the following description of preferred embodiments, a region represented by the cross section along the line I—I will be referred to as a first region, the cross section along the line II—II as a second region, and the peripheral region as a third region.

As shown in FIGS. 2A and 2B, the flash memory cell in accordance with a preferred embodiment of the present invention includes, in the first and second regions, second gate oxide films 42a and floating gates 43a stacked on prescribed regions of a semiconductor substrate 41. Gate oxide films 46a and control gates 47a are formed in one direction to cover the floating gates 43a. First cap oxide films 48 are then formed on the control gates 47a, and first sidewall spacers 51 are formed on both sides of each of the control gates 47a and the first cap oxide films 48. Buried regions 45 are formed in a surface of the semiconductor substrate 41 under the gate oxide films 42a and the floating gates 43a perpendicular to the control gates 47a, such that one side of the floating gate 43a covers the buried region 45 along a direction. A contact region at an end of each of the buried regions 45 is formed to provide a contact with a wiring layer. A field oxide film 54 is formed between the control gates 47a in the same direction with the control gates 47a. An erasure gate 57a is formed between the control gates 47a. A second cap oxide film 58a is formed on each of the erasure gate 57a, and fourth sidewall spacers 60 are formed at both sides of the erasure gates 57a and the second cap oxide film 58a. A seventh oxide film 62 is formed on the entire surface, and a planar protection film 63 is formed on the seventh oxide film 62.

In the third region, the third gate oxide film 56b, the second gate electrode 57b and the second cap oxide film 58b are formed successively on the semiconductor substrate 41. Fourth sidewall spacers 60 are formed at both sides of the cap oxide film 58b and the second gate electrodes 57b. LDD(Lightly Doped Drain) regions 59 are formed in a surface of the semiconductor substrate 41 under the fourth sidewall spacers 60. Source/drain regions 61 are formed in the semiconductor substrate 41 on both sides of the fourth sidewall spacers 60 and the second gate electrode 57b deeper than the LDD regions 59. Field oxide films 54 are formed on both sides of the source/drain regions 61. The seventh oxide film 62 and the planar protection film 63 are formed successively on the entire surface of the semiconductor substrate 41.

A method for fabricating a flash memory cell in accordance with a first preferred embodiment of the present invention will be explained with reference to the attached drawings. FIGS. 3A–3F illustrate the precess steps for fabricating a flash memory in accordance with a first preferred embodiment of the present invention. Each of FIGS. 3A–3F illustrate, from left to right, the cross sections of a cell region along the lines I—I and II—II as shown in FIG. 2A, and a peripheral region. In the following description, the region represented by the cross section along the line I—I will be referred to as a first region, the cross section along the line II—II as a second region, and the peripheral region as a third region.

First, an N well and a P well, neither of which are shown in the drawing, are formed in prescribed regions of the semiconductor substrate 41. Then, as shown in FIG. 3A, a first oxide film 42 is deposited on the entire surface of the semiconductor substrate 41, and a polysilicon layer 43 is formed on the first oxide film 42 by low pressure chemical vapor deposition. A first photoresist film 44 is deposited on the first polysilicon layer 43 and subjected to selective patterning in the first and second regions by exposure and development. The polysilicon layer 43 and the first oxide film 42 are then subjected to anisotropic etching using the patterned first photoresist film 44 as a mask to form first gate oxide films 42a and the floating gates 43a. Then, N-type arsenic ions are injected into exposed semiconductor substrate 41 at an angle θ with respect to the vertical line using the patterned first photoresist film 44, the first gate oxide films 42a and the floating gates 43a as masks to form buried regions 45 preferably with a concentration of $1 \times 10^{15}$ atoms/cm$^3$. The buried regions 45 are formed in the semiconductor substrate 41 under a portion of the first gate oxide film 42a and the floating gate 43a while the first oxide film 42, the first polysilicon layer 43, and the first photoresist film 44 remain unchanged in the third region, which is the peripheral region. A distance "a" from one side of the floating gate 43a to the buried region represents a length of a control gate channel to be formed later, and a distance "b" represents a minimum distance between floating gates to be formed later. The angle θ in the formation of the buried regions 45 is preferably determined to satisfy the following equation:

$$\tan \theta = \{a/(\text{thickness of the first gate oxide film} + \text{thickness of the floating gate} + \text{thickness of the photoresist film})\} \geq \{b/2\}.$$

As shown in FIG. 3B, the first photoresist film 44 is removed, and a thin second oxide film 46 is formed on the semiconductor substrate 41 and on the floating gates 43a by thermal oxidation or low pressure chemical vapor deposition. Then, a second polysilicon layer 47, a first cap oxide film 48, and a cap nitride film 49 are formed on the second oxide film 46 in succession by low pressure chemical vapor deposition. The cap nitride film 49 is formed preferably to a thickness below 2000 Å. A second photoresist film (not shown) is coated on the cap nitride film 49 and subjected to selective patterning by exposure and development. The cap nitride film 49, the first cap oxide film 48, and the second polysilicon layer 47 are then subjected to anisotropic etching in succession using the patterned second photoresist film as a mask to form second gate oxide films 46a, second control gates 47a, first cap oxide films 48, and cap nitride films 49 in the first, and second regions, and a second gate oxide film 46a and a first gate electrode 47b in the third region. Then, a third oxide film 50 is deposited and subjected to blanket anisotropic etching to form first sidewall spacers 51 at both sides of the control gates 47a in the second region, the first gate electrode 47b in the third region, and the first cap oxide films 48 in the second and third regions. The first polysilicon layer 43 is etched back using the first sidewall spacers 51 and the cap nitride film 49 as masks.

As shown in FIG. 3C, a nitride film 52 is deposited on an entire surface by low pressure chemical vapor deposition and etched back to form second sidewall spacers 52a in the second and third regions. The second sidewall spacers 52a are formed preferably to a thickness below 2000 Å. P-type boron ions (B or BF$_2$) are injected into the semiconductor substrate 41 on both sides of the floating gates 43a and the first polysilicon layer 43 to form channel stop regions 53. The channel stop regions 53 preferably have an impurity concentration of $1 \times 10^{13}$ atoms/cm$^3$, which is lower than that of the buried regions 45.

As shown in FIG. 3D, a thermal oxidation process is conducted to form field oxide films 54 using the cap nitride films 49, and the first and second sidewall spacers 51, 52a as masks. In this instance, the cap nitride films 49 and the first, and second sidewall spacers 51, 52a are used as masks for preventing diffusion of oxygen or H$_2$O. Also, the floating gates 43a, the control gates 47a, a first polysilicon layer 43, and the first gate electrode 47b reduce bird's beak in the thermal oxidation for forming the field oxide films 54 and ease stress generated in the fabrication process. Thus, the channel stop regions 53 are formed to enclose the field oxide films 54 from below. The field oxide films 54 are formed preferably to a thickness of 2500 Å to improve a step coverage in a later step as the preferred thickness is about 65% of an isolating oxide film deposited in a related chemical vapor deposition method.

Figure 3E:
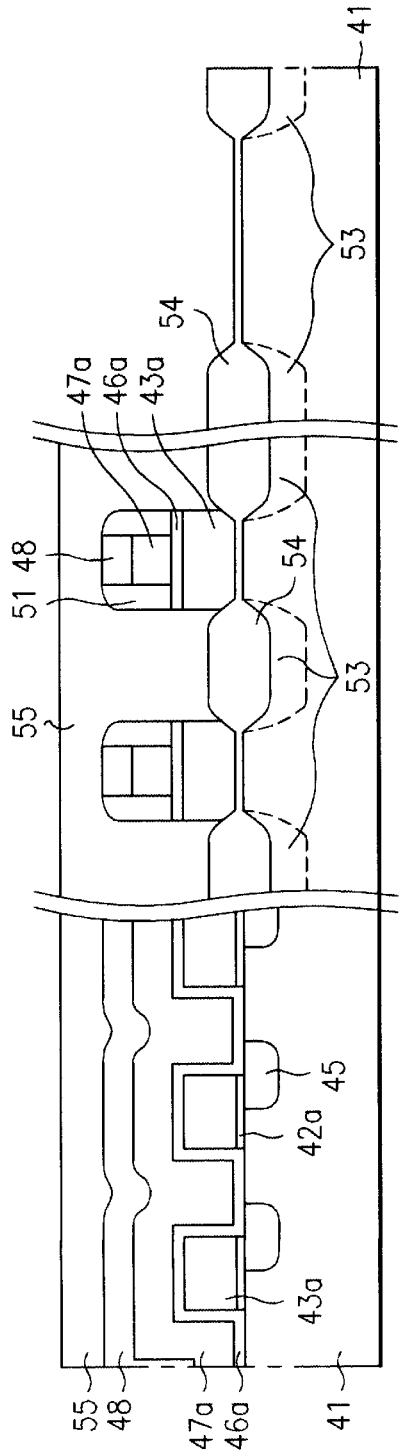

As shown in FIG. 3E, the cap nitride films 49 and the second sidewall spacers 52a are removed, for example, by dipping in a hot phosphoric acid (H$_3$PO$_4$) solution. Then, a third photoresist film 55 is coated on an entire surface and subjected to selective patterning by exposure and development to remove the third photoresist film 55 only in the third region. The first sidewall spacers 51 and the first cap oxide film 48 in the third region are removed by wet etching using the patterned third photoresist film 55 as a mask. The first gate electrodes 47b are then removed by anisotropic etching. The second gate oxide films 46a in the third region are also removed by wet etching. Finally, the first polysilicon layer 43 in the third region is removed by anisotropic etching.

Figure 3F:
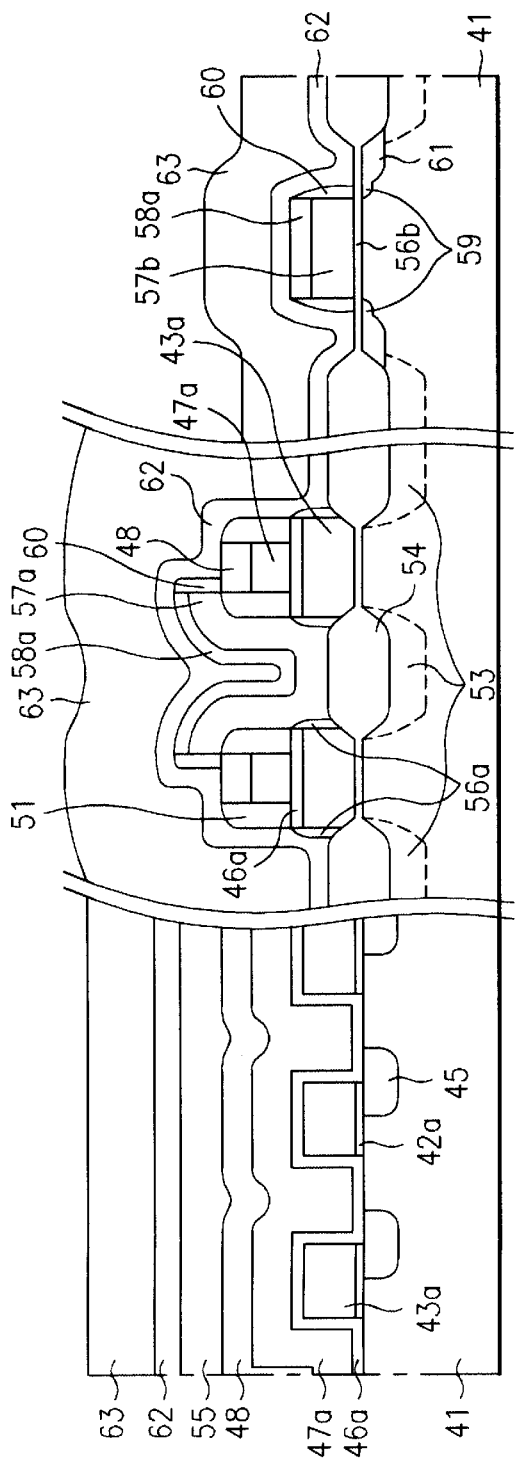

As shown in FIG. 3F, after removing the third photoresist film 55, a fourth oxide film is deposited and etched back to form third sidewall spacers 56a for the first and second regions, and a third gate oxide film 56b for the third region. Then, a third polysilicon layer and a fifth oxide film are deposited and patterned to form an erasure gate 57a and a cap oxide film 58a in the second region, and a second gate electrode 57b and a second cap oxide film 58a in the third region using a gate forming mask. The semiconductor substrate 41 on both sides of the floating gate 43a, the control gate 47a, and the second gate electrode 57b are lightly doped with N-type impurity ions to form LDD (Lightly Doped Drain) regions 59 therein, respectively. Then, a sixth oxide film is deposited and etched back to form fourth sidewall spacers 60 at both sides of the erasure gate 57a and the second gate electrode 57b. The semiconductor substrate 41 on both sides of the floating gates 43a and the fourth sidewall spacers 43a in the first and second regions are heavily doped with N-type impurity ions, to form source/drain regions 61. A seventh oxide film 62 and a planarizing protection film 63 are deposited on the entire surface. Then, contact holes (not shown) are formed to expose portions of the buried regions 45, and a wiring layer (not shown) is formed to be in contact with the buried regions 45.

A method for fabricating a flash memory cell in accordance with a second preferred embodiment of the present invention will be explained with reference to the attached drawings.

Figure 4A:
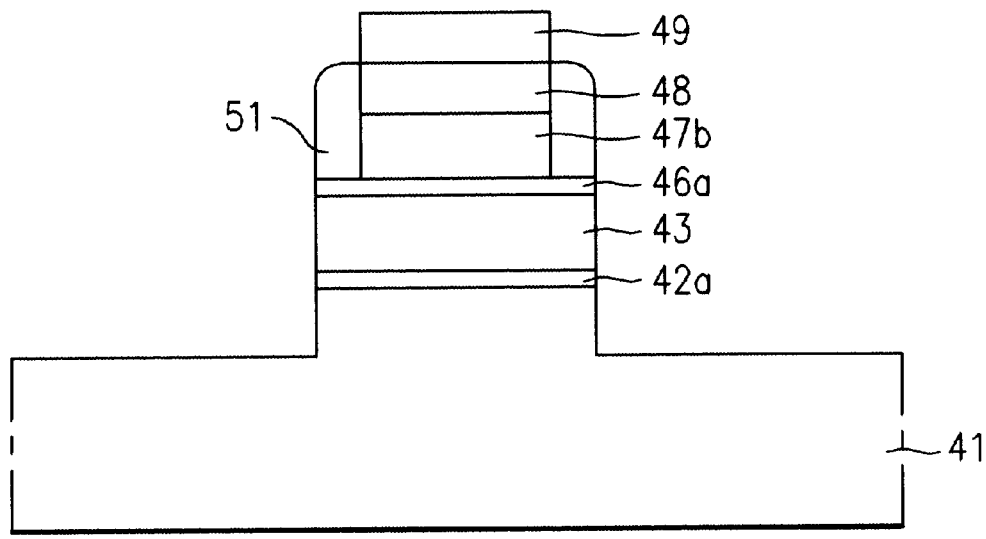
Figure 4B:
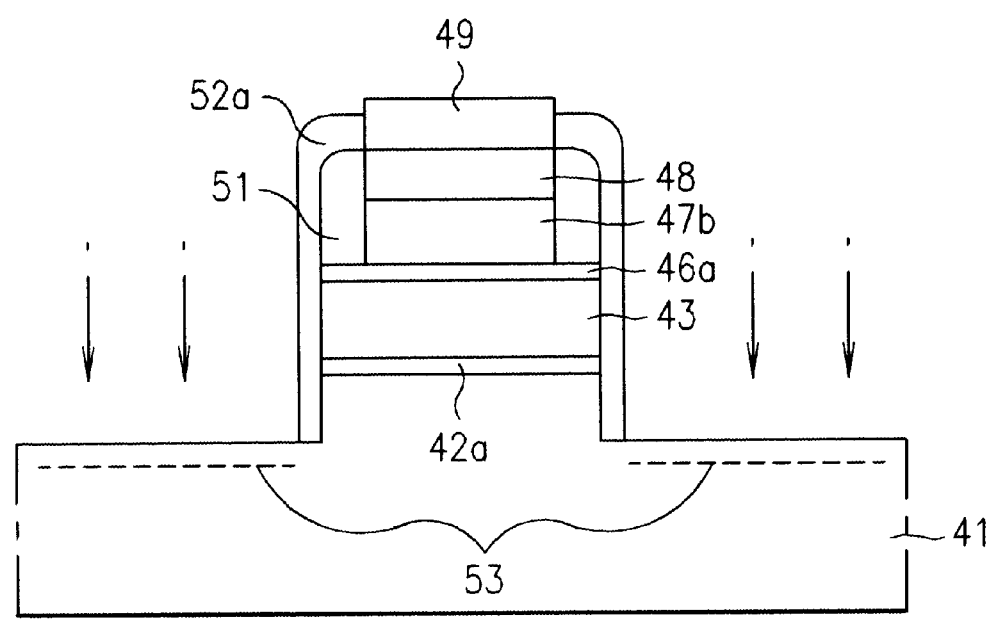

The method according to the second preferred embodiment is substantially the same as the method according to the first preferred embodiment except the following. After the first polysilicon 43 is etched back using the first sidewall spacers 51 and the cap nitride film 49 in the third region as shown in FIG. 3B, the first gate oxide film 42a and the semiconductor substrate 41 on both sides of the first polysilicon layer 43 are further etched to a prescribed depth as shown in FIG. 4A. Then, a nitride film 52 is deposited and etched back to form second sidewall spacers 52a as shown in FIG. 4B. Channel stop regions 53 are formed in the semiconductor substrate 41 exposed by the etching. With this embodiment, a step coverage can be further reduced during a later formation of a field oxide film 54.

A method for fabricating a flash memory cell in accordance with a third preferred embodiment of the present invention will be explained with reference to the attached drawings.

When the first polysilicon 43 in the first and second regions are removed to form the floating gates 43a as in the first embodiment as shown in FIG. 3A, the first polysilicon layer 43 in the third region is also removed by exposing the first photoresist film 44 in the third region. Thereafter, buried regions 45 are formed. Accordingly, the number of process steps of etching or removing the first polysilicon layer 43 in the third region explained in association with FIGS. 3B and 3E can be reduced.

The method for fabricating a flash memory cell in accordance with preferred embodiments of the present invention has the following advantages. First, since separate mask forming steps are not needed in the formation of the buried regions, field oxide films, and the channel stop regions, fabricating steps can be simplified. Second, the formation of the floating gates, buried regions, and the field oxide films by self-alignment prevents degradation of the cell performance resulting from mis-alignment and allows for a reduction in the cell size to improve a device packing density. Third, the formation of the floating gates and the control gate before the formation of the field oxide films results in a relatively greater fabrication tolerance in the formation of the floating gates and the control gates compared to the related art, together with a greater tolerance in the photoetching step after formation of the erasure gates.

It will be apparent to those skilled in the art that various modifications and variations can be made in the method for fabricating a flash memory cell of the present invention without departing from the spirit or scope of the invention. Thus, it is intended that the present invention cover the modifications and variations of this invention provided they come within the scope of the appended claims and their equivalents.

What is claimed is:

1. A method for fabricating a flash memory cell having a cell region and a peripheral region, the method comprising the steps of:

forming first gate insulating films and floating gates on a substrate in succession, the first gate insulating films and floating gates extending in a first direction;

making a tilted ion injection into portions of the substrate under the floating gates at an angle with respect to a line perpendicular to the substrate, to form buried regions extending in the first direction;

forming control gates, and first and second cap insulating films, each having a portion crossing the floating gates in a second direction substantially perpendicular to the first direction in the cell region, and forming polysilicon pattern layers, second gate insulating films, first gate electrodes, and first and second cap insulating films in the peripheral region;

forming first sidewall spacers at a plurality of sides of the control gates and the first cap insulating films in the cell region, and at a plurality of sides of the first gate electrodes and first cap insulating films in the peripheral region;

forming second sidewall spacers at a plurality of sides of the floating gates, the first sidewall spacers, and the second cap insulating films in the cell region, and at a plurality of sides of the polysilicon pattern layers, the first sidewall spacers, and the second cap insulating films in the peripheral region;

forming field insulating films on the substrate using the floating gates, the control gates, the polysilicon pattern layers, and the first gate electrodes as masks;

removing in the peripheral region the second sidewall spacers, the second cap insulating films, the first cap insulating films, the first sidewall spacers, the first gate electrodes, the second gate insulating films, and the polysilicon pattern layers;

forming erasure gates on the field insulating films between the floating gates extending in the second direction in the cell region and forming second gates in the peripheral region.

2. The method as claimed in claim 1, wherein the buried region is formed by coating and patterning a photoresist film, forming floating gates, and conducting a self-aligned process using the photoresist film and the floating gates as masks.

3. The method as claimed in claim 1, wherein the tilted ion injection is conducted at an angle $\theta$, with respect to the line perpendicular to the substrate, satisfying the equation $$\tan\theta = \{a/(a\text{ thickness of the first gate oxide film} + a\text{ thickness of the floating gate} + a\text{ thickness of the photoresist film})\} \geq \{b/2\},$$

wherein "a" is a shortest channel length, "b" is a shortest distance between the floating gates.

4. The method as claimed in claim 1, wherein the first cap insulating films and the first sidewall spacers are formed of an oxide.

5. The method as claimed in claim 1, wherein the second cap insulating films and the second sidewall spacers are formed of a nitride.

6. The method as claimed in claim 1, wherein the buried regions, the floating gates, the control gates, and the field insulating films are self-aligned to one another.

7. The method as claimed in claim 1, wherein the second cap insulating films and the second sidewall spacers each have thicknesses of about 2000 Å or less.

8. The method as claimed in claim 1, further comprising the step of forming channel stop regions using the second cap insulating films and the second sidewall spacers as masks before forming the field insulating films.

9. The method as claimed in claim 8, wherein the buried regions have a greater impurity concentration than do the channel stop regions.

10. The method as claimed in claim 1, further comprising the steps of:

forming third cap insulating films on the second gates;

forming lightly doped drain regions in the substrate in the peripheral region using the third cap insulating films, the second gates, and the field insulating films as masks;

forming third sidewall spacers on a plurality of sides of the second gates and third cap insulating films;

forming source and drain regions in the substrate in the peripheral region using the third cap insulating films and third sidewall spacers as masks.

11. A method for fabricating a flash memory cell, the method comprising the steps of:

forming first gate insulating films and polysilicon layers in succession on a substrate, wherein the first gate insulating films and the polysilicon layers extend in a first direction;

forming buried regions in the substrate under portions of the polysilicon layers;

forming second insulating films, control gates, and cap insulating films in succession on the substrate and the polysilicon layers;

forming first sidewall spacers at a plurality of sides of the control gates;

forming floating gates by patterning the polysilicon layers using the first sidewall spacers as masks;

forming second sidewall spacers at a plurality of sides of the floating gates and the first sidewall spacers;

forming channel stop regions using the second sidewall spacers as masks;

forming field insulating films on the substrate between the floating gates; and forming erasure gates on the field insulating films between the floating gates.

12. The method according to claim 11, wherein the buried regions have a greater impurity concentration than do the channel stop regions.

13. The method according to claim 11, wherein the control gates extend in a second direction substantially perpendicular to the first direction.

14. The method according to claim 11, wherein the step of forming floating gates includes the step of removing portions of the polysilicon layers exposed after the first sidewall spacers are formed.

15. The method according to claim 14, wherein the step of forming floating gates further includes the steps of:

removing portions of the first gate insulating layers using the first sidewall spacers as masks, and removing a portion of the substrate at regions exposed after the step of removing portions of the first gate insulating layers.

16. The method according to claim 11, wherein the field insulating films and the erasure gates extend in a second direction substantially perpendicular to the first direction.

17. The method according to claim 11, wherein the field insulating films are thermally grown oxide films having a thickness of about 2500 Å or less.

18. The method according to claim 11, wherein the field insulating films are formed using the floating gates as masks.

19. A method for fabricating a flash memory cell, the method comprising the steps of:

forming first gate insulating films and polysilicon layers in succession on a substrate, wherein the first gate insulating films and the polysilicon layers extend in a first direction;

forming buried regions in the substrate under portions of the polysilicon layers by performing a tilted ion injection at an angle $\theta$ with respect to a line perpendicular to the substrate using the insulating films and the polysilicon layers as masks;

forming second insulating films, control gates, and cap insulating films in succession on the substrate and the polysilicon layers;

forming first sidewall spacers at a plurality of sides of the control gates;

forming floating gates by patterning the polysilicon layers using the first sidewall spacers as masks;

forming field insulating films on the substrate between the floating gates; and forming erasure gates on the field insulating films between the floating gates, wherein the angle $\theta$ satisfies the equation $$\tan\theta = \{a/(\text{a thickness of the first gate insulating film} + \text{a thickness of the floating gate} + \text{a thickness of a photoresist film})\} \geq \{b/2\},$$

wherein "a" is a shortest channel length, "b" is a shortest distance between the floating gates.

20. The method according to claim 19, wherein the step of forming floating gates includes the step of removing portions of the polysilicon layers exposed after the first sidewall spacers are formed.

21. The method according to claim 20, wherein the step of forming floating gates further includes the steps of:

removing portions of the first gate insulating layers using the first sidewall spacers as masks, and removing a portion of the substrate at regions exposed after the step of removing portions of the first gate insulating layers.

* * * * *